(12) United States Patent
Billiot et al.

(10) Patent No.: US 6,493,808 B1
(45) Date of Patent: Dec. 10, 2002

(54) DEVICE AND PROCESS FOR TESTING A REPROGRAMMABLE NONVOLATILE MEMORY

(75) Inventors: Gérard Billiot, Mbylan (FR); Elisabeth Crochon, Poisat (FR)

(73) Assignee: Commissariat a l'Energie Atomique, Paris (FR)

( * ) Notice: Subject to any disclaimer, the term of this patent is extended or adjusted under 35 U.S.C. 154(b) by 0 days.

(21) Appl. No.: 09/489,110

(22) Filed: Jan. 21, 2000

(30) Foreign Application Priority Data

Jan. 22, 1999 (FR) .............................. 99 00692

(51) Int. Cl.[7] .............................................. G06F 12/00
(52) U.S. Cl. ...................... 711/163; 711/152; 711/103; 714/718; 714/738; 365/201
(58) Field of Search ................. 711/103, 163, 711/145, 152; 365/195, 201, 185.29, 185.33, 230.03; 714/718, 7, 36, 710, 725, 728, 738

(56) References Cited

U.S. PATENT DOCUMENTS

| | | | |
|---|---|---|---|
| 4,975,870 A | * 12/1990 | Knicely et al. | ............. 711/152 |
| 5,175,840 A | * 12/1992 | Sawase et al. | ............. 711/103 |
| 5,264,742 A | 11/1993 | Sourgen | ..................... 326/37 |
| 5,345,413 A | 9/1994 | Fisher et al. | ................. 365/96 |
| 5,394,467 A | 2/1995 | Kepley, III et al. | ......... 379/438 |
| 5,826,007 A | * 10/1998 | Sakaki et al. | ................. 714/42 |
| 5,890,191 A | * 3/1999 | Espinor et al. | ............ 711/103 |

* cited by examiner

*Primary Examiner*—Do Hyun Yoo
*Assistant Examiner*—Nasser Moazzami
(74) *Attorney, Agent, or Firm*—Pearne & Gordon LLP

(57) ABSTRACT

The invention relates to a device for testing a reprogramable non-volatile memory having dedicated areas protectable in reading, writing and/or erasing and whose access rights consist of configuration words (MC) saved in a configuration area of the memory, said device comprising message transmission/reception means (10) and a received message logic control unit (11) and access controls to the memory, characterized in that it comprises at least one temporary register ensuring an emulation of these access rights, so as to render access protections reversible or irreversible. The invention also relates to the process performed by said device.

4 Claims, 2 Drawing Sheets

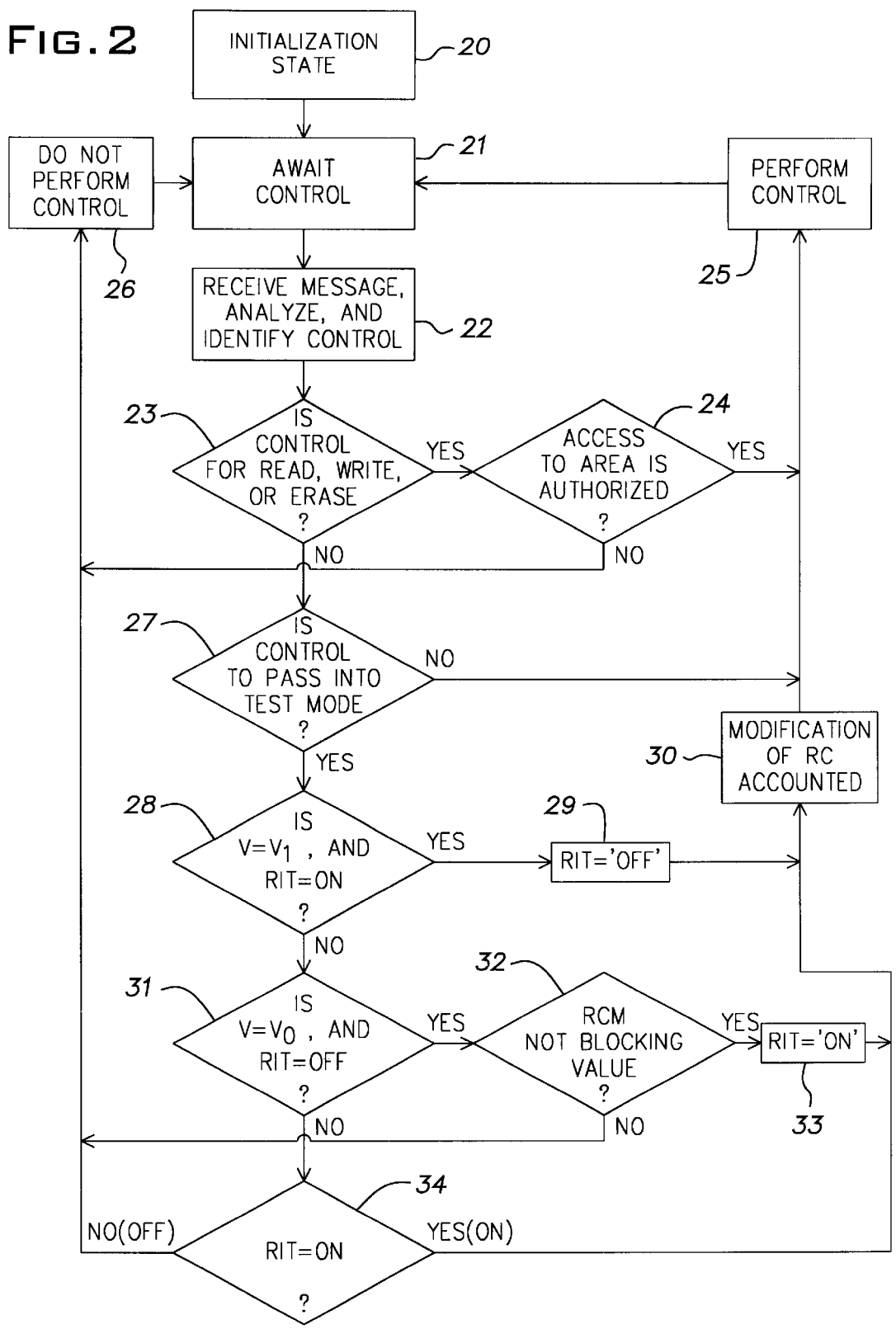

DEVICE AND PROCESS FOR TESTING A REPROGRAMMABLE NONVOLATILE MEMORY

FIELD OF THE INVENTION

The invention relates to a device for testing a reprogrammable non-volatile memory having dedicated areas which can be protected in reading, writing and/or erasing. It also relates to the process used in said device for testing the integrality of the memory before it is made available to the user for the application for which it is intended.

The invention has applications in all fields using a reprogrammable non-volatile memory system, whose accesses are regulated. It can in particular be used in contactless identification systems such as identification labels for tracking objects or for remote ticketing.

PRIOR ART

Reprogrammable non-volatile memory systems having dedicated areas protectable in reading, writing and/or erasing comprise means for controlling access rights to said areas. These means consist of a control logic integrating hardware or software fuses authorizing or not authorizing reading, writing and/or erasing or clearing of all or part of the content of said areas.

Hardware fuses which are very reliable with respect to fraud suffer from the disadvantage of requiring a breakdown overvoltage which, in certain applications, is not available. This is particularly the case in most contactless identification systems.

So-called software fuses consist of one or more reprogrammable non-volatile memory bits, known as latch bits. In the case of a memory having e.g. several dedicated areas protected in writing and erasing, the latch bit of each area authorizes or does not authorize access of said area in writing and erasing. For example, if the bit is at "0", the memory area dependent on said latch bit is accessible in writing and erasing and if it is at "1" said memory area is neither accessible in writing nor in erasing. However, no matter what the value of the latch bit, the memory area in question is accessible in reading, because reading does not form the object of any protection.

However, this type of protection causes a problem during the initialization of the memory prior to its use for the target application to which it is intended, i.e. before being made available to the user. Thus, at the end of manufacture, the memory has a random configuration, i.e. the bits can be either at "0" or "1". It is therefore necessary to initialize the memory, which requires accessing all the areas of the memory, no matter what the value of the latch bits.

Two methods are generally used for solving the memory initialization problem.

The first method consists of adding to the memory test pads making it possible to directly access the memory by presetting certain states in the control logic, i.e. certain latch bits.

However, in the case of integrated circuits, the introduction of these specific test bits increases the size of the circuits and requires a supplementary test stage at the end of the production line, which increases the circuit manufacturing costs.

The second method described in U.S. Pat. No. 5,394,367 consists of using a configuration word. This configuration word is a set of saved bits in a configuration area of the memory. It protects the access to the latch bits in the following way. When the configuration word differs from a blocking value defined by the user, all the protected areas are accessible in reading, writing and erasing. When the configuration word is identical to the blocking value, the access rights to the protected areas are regulated by the latch bits. The probability that the blocking value is that of the configuration word at the end of manufacture becomes smaller as the number of bits becomes larger and the blocking value is well chosen. This method does not require the introduction of any supplementary element and makes it possible to minimize the surface area of the integrated circuits and simplify the implementation of the initialization phase.

However, apart from the initialization of the memory, prior to the use of the memory in its target application, it is also necessary to check the satisfactory operation of all the elements of the memory and also the control logic controlling accesses to the memory. This check must be carried out, preferably in an exhaustive manner. For this purpose, it is necessary to be able to modify at random the entire memory (including the configuration area) and test all the states of the control logic and in particular those imposed by the particular values of the configuration area. However, the method described in U.S. Pat. No. 5,394,467 does not permit such a verification (or memory testing). It only permits an operation in the so-called "normal" checking mode of the memory access rights.

DESCRIPTION OF THE INVENTION

The object of the invention is to solve the problems of the procedures described hereinbefore. To this end, it proposes a process and a device permitting an operation in two modes, namely a "test" mode, in which all the memory areas are accessible no matter what the protection of said areas, which makes it possible to perform an exhaustive test on the memory and control logic and a "normal" mode in which access protections are irreversible, the configuration area then only being modifiable in the case where the access restrictions to the areas are increased.

More specifically, the invention relates to a device for testing a reprogrammable non-volatile memory having dedicated areas protectable in reading and/or writing and/or erasing and whose access rights consist of configuration words saved in a configuration area of the memory, said device comprising message transition/reception means and a received message logic control unit and memory access controls, characterized in that it comprises at least one temporary register ensuring an emulation of these access rights so as to make the access protections reversible when the memory is in a "test" mode and irreversible in other cases.

Advantageously, the temporary register comprises:
a configuration register having an identical size and structure to the configuration area of the memory and a test indication register.

The invention also relates to a process for testing a reprogrammable non-volatile memory using the above device. This process is characterized in that it comprises:
a) reading the content of the memory configuration area, transferring the said content into the temporary register and initializing the test indication register,
b) effecting at least one modification control of the configuration register of the temporary register whilst checking the access rights contained in the temporary register,
c) testing the modification of the configuration register by reading and/or writing and/or erasing controls on the memory areas in question.

Between stages a and b, the process according to the invention consists of comparing the value of the temporary register with one or more previously defined blocking values written into the control logic (11) and, when said two values are equal, making modifications to the configuration area irreversible and when they are different, authorizing reversible modifications of the configuration area. In other words, only the value of the memory configuration word (MCM) controls the latching or non-latching of the access rights.

According to an embodiment of the invention are immediately taken into account, the new content of the configuration area being immediately transferred into the temporary register.

According to another embodiment, the configuration area modification controls are taken into account in deferred manner by the temporary register, i.e. when the "correct supply" signal is again activated.

BRIEF DESCRIPTION OF THE DRAWINGS

FIG. 2 shows the function chart of the process using this device.

DETAILED DESCRIPTION OF EMBODIMENTS OF THE INVENTION

Figure 1:
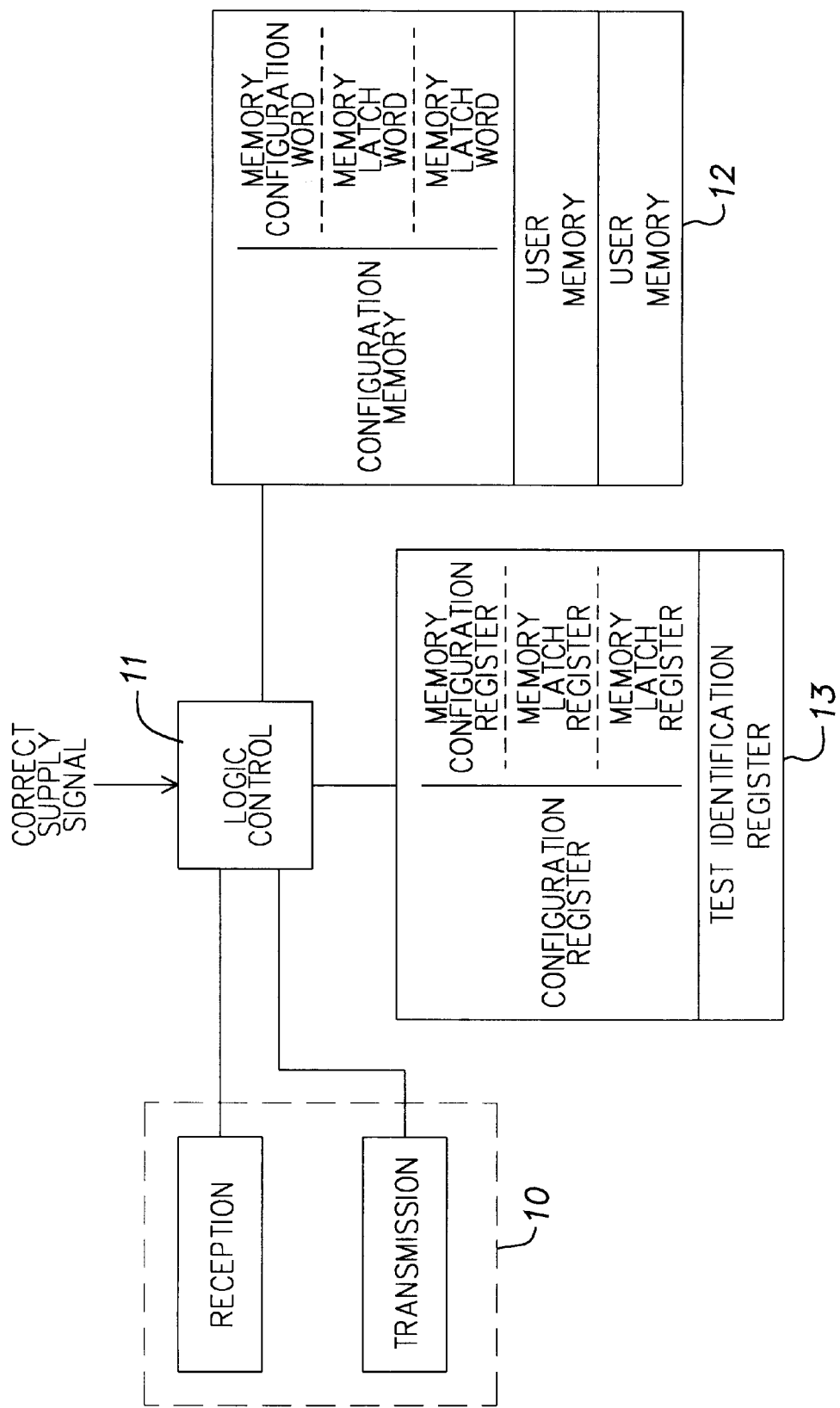
FIG. 1 diagrammatically shows the device according to the invention.

FIG. 1 shows the general architecture of the device according to the invention. This device comprises message transmission/reception (E/R) means 10. It also comprises a received message logic control unit and memory access controls. When the "correct supply" signal is active, said logic unit 11, also called "control logic", ensures the reading and analysis of the messages received by the E/R means 10. It also ensures the performance of the access controls to the memory 12 as a function of the access rights of each area of the memory. Finally, it ensures the dispatch of a report concerning the performance or non-performance of the control by the E/R means 10.

In other words, it is the control logic 11 which, after checking the access rights of a considered area of the memory, authorizes or does not authorize access to said memory area. Said control logic 11 is directly linked with the memory 12, which is a reprogrammable non-volatile memory and can e.g. be an EEPROM.

The memory 12 is subdivided into several areas:
- one or more areas intended for the target application, called user memories MU—in the embodiment shown in FIG. 1 the case of a memory with two user memories MU is illustrated,
- a configuration area, also called configuration memory MC, which itself comprises several modules:
  - a module containing a memory configuration word MCM, which is a set of n bits encoding the access right to the configuration area MC and
  - one or more modules each of which contains a memory latch word MVM, which is a set of m bits encoding the access rights to the user memory-type protected area with which it is associated.

The device according to the invention also comprises at least one temporary register 13 ensuring the saving and emulation of the access rights to the memory. The temporary register 13 comprises:
- a test identification register RIT, whose function is to validate or not the test phase of the memory, known as the "test" mode. When the register RIT is on "ON", the device operates in the "test" mode, i.e. the mode in which the configuration register is reversibly modifiable, but when it is in the "OFF" mode, the device functions in the so-called "normal" mode, i.e. when the configuration register cannot be modified independently of the configuration area,
- a configuration register RC which is the image of the configuration area MC, said register consequently having the same size as the configuration area and comprises the same modules:
  - a module constituting the memory configuration register RCM, identical to the configuration word MCM and
  - one or more modules each of which constitutes a memory latch register RVM, identical to the latch word MVM.

For said device to operate in the "test" mode, it is necessary for said mode to be activated. Activation and deactivation of the "test" mode, as well as the modification of the access rights in the "test" mode are implemented by means of specific controls comprising at least:
- a keyword, whose function is to identify and separate these controls from other types of controls and
- a value parameter V encoded on w bits and whose function is to modify all or part of the configuration register RC. According to a preferred embodiment of the invention, said parameter V assumes two particular and different values $V_0$ and $V_1$, which respectively also make possible the activation and deactivation of the "test" mode, i.e. the modification of the test indication register RIT.

This device implements a process, whose main stages are illustrated in FIG. 2. This process takes place as soon as the "correct supply" signal becomes active. Thus, when the "correct supply" becomes active, the control logic 11 passes into an initialization state 20, which more particularly leads to the reading of the content of the configuration area MC and its transfer into the configuration register RC, as well as the positioning on "OFF" of the test indication register RIT. Thus, this saves the content of the configuration area MC transferred into the configuration register RC. The content of the configuration register RC then makes it possible to control accesses of different areas of the memory 13.

The device is then placed in a state 21 awaiting a control. As soon as a message is received, the control logic analyzes and identifies the control associated with this message (stage 22).

A test 23 then consists of checking whether it is a control intended to activate a reading, writing or erasing operation aiming at affecting all or part of one of the memory areas. If this is the case, a check is made on the access rights contained in the configuration register. If access to said area is authorized, then the control is performed in stage 25. If access is refused, the control is not performed (stage 26). The device returns to a control waiting state no matter whether the control is performed or not.

If it is not a control aiming at affecting one of the areas of the memory, a test 27 consists of checking whether it is a control for passing into the "test" mode. If this is not the case, the control is performed in 25. If it is a test control, the control logic carries out a check on the parameter V of the control and on the register RIT (stage 28):
- if the control corresponds to a deactivation of the "test" mode, i.e. if the parameter V has the value $V_1$ and if the register RIT is on "ON", whereas the register RIT is on "OFF" (stage 29) and the modification of the configuration register RC is taken into account (stage 30), this signifies that the control is performed, if the answer to the test 28 is no, then a test 31 checks if the control corresponds to an activation of the "test" mode, i.e. if the parameter V has the value $V_0$ and if the register RIT is at "OFF":

if this is the case, then the control logic checks that the memory configuration register RCM is not at its blocking value (stage 32) and if it is not at its blocking value, then the register RIT is set to "ON" (stage 33) and the configuration register is modified (stage 30), which means that the control is performed—if the RCM is at its blocking value, the control is not performed (stage 26), if this is not the case, the logic 12 controls the value of the register RIT in stage 34 and if RIT is at "ON", the modification stage 30 of the configuration register RC takes place in accordance with the value of V, whereas if RIT is at "OFF", the control is not performed (stage 26).

In other words, when the control relates to the "test" mode (answer "YES" to module 27), there are then four possibilities.

1. When the control corresponds to a deactivation of the "test" mode and when RIT is at "ON", whereas the register RIT is at "OFF" and the deactivation control is performed.

2. When the control corresponds to an activation of the "test" mode and when RIT is at "OFF", then a control of the access rights to the configuration area MC is performed by the register RCM and if the latter permits the activation of the "test" mode, i.e. the RCM is different from a certain blocking value, then the register RIT is positioned on "ON" and the activation control is performed, if not no control is performed and the register RIT remains on "OFF".

3. When the control corresponds to an activation and the RIT is already at "ON", then the activation control is performed (solely in the embodiment where $V_0 \neq V_1$).

4. If the test control is neither an activation nor a deactivation (i.e. $V \neq V_0$ and $V \neq V_1$), it corresponds to a modification of the configuration register RC. This makes it possible to emulate a content for the configuration area MC without having to really load this content into the configuration area and consequently test all the memory access conditions, including those to the configuration area, with any random value. However, this control is performed if and only if the RIT register is on "ON".

In all cases where "test" type controls are performed, the value of parameter V is used for modifying the configuration register content. Thus, the modification of the configuration register RC takes place under the condition of the initial content of the configuration register RC and consequently the configuration area MC by means of the test indication register RIT.

Thus, when the blocking value is not written into the memory configuration word MCM, it is possible to deactivate the integrated circuit "inactive correct supply signal" and therefore return to the test mode for the number of times necessary without requiring other blocking means, particularly for retention and/or endurance tests, which can require successive energizations.

When the device is considered to be correct from the test standpoint, the blocking value is written into the memory configuration word MCM, the latch words MVM are reinitialized, as well as all the user areas MU prior to any test mode deactivation operation. This deactivation can be performed by the test control described hereinbefore containing a parameter $V_1$ analyzed as the end of a test.

In the preceding description of FIG. 2, it will be noted that the stages 27 to 34 solely relate to the operation of the device according to the invention in the "test" mode. As has been shown, in the "test" mode all the memory areas are accessible in reading, writing and erasing, as soon as certain previously given conditions are verified.

Stages 20 to 26 correspond to a so-called "normal" mode, i.e. a mode in which it is possible to use the memory for its dedicated operation. In the "normal" mode, the memory areas are accessible solely to the extent that their access rights are checked and authorization to access said areas is given by the configuration register RC.

In the "normal" mode, an access control to the user areas is conditioned by the access rights stored in the memory latch register RVM. A modification control of the configuration area MC is conditioned by the configuration register RCM. If the latter is at the blocking value, then the memory configuration word module MCM is protected in writing and erasing and the modules MVM are protected in erasing, i.e. the access rights to the user memory areas MU become increasingly restrictive. Access protections are then irreversible to the extent that the latch word is written into the memory configuration word MCM and consequently transmitted into the memory configuration register RCM.

For example, an applicative area dedicated to the recording of a secret key must initially be accessible in reading, writing and erasing. At the end of valorization of the area, i.e. after writing and checking the same, e.g. by reading, said area will be protected in reading, whilst said key will no longer be directly accessible, but also in writing/erasing if only a single key is to be written.

In the "normal" mode, for any modification control of the content of the configuration area MC, interactions between the configuration area and the configuration register make it possible to take account of these modifications. These interactions can be controlled in two different ways.

The first involves an immediate taking into account. During the implementation by the control logic of a writing and/or erasing modification operation performed on the configuration area MC, the control logic carries out either the modification of the configuration area into the configuration register, or a simultaneous modification on the configuration area and on the configuration register. Thus, the modification of the configuration area is immediately taken into account at the configuration register.

In the second case there is a deferred taking into account. During the performance by the control logic of a writing and/or erasing modification operation performed on the configuration area MC, the control logic solely carries out the modification of said area MC. The validation of this modification at the configuration register RC takes place by interrupting the transaction taking place and therefore by deactivating the "correct supply" signal. Thus, during the following activation of said "correct supply" signal, the configuration register will again be loaded with the new content of the configuration register, so that modifications performed during the preceding transaction would be effective.

No matter in what way the modifications are taken into account, as soon as the programming or transfer of the blocking value into the memory configuration register RCM has taken place, passage into the "test" mode is prevented.

The above-described process according to the invention makes it possible to reversibly test the memory without having to add supplementary elements during its manufacture and at any time during its use. Thus, the manufacture of an integrated circuit incorporating a non-volatile memory equipped with this device has a cost well below that of the aforementioned, conventional procedures.

Thus, the present invention can be applied to numerous types of memory systems and in particular to integrated circuits, contactless cards, transportation tickets and identification labels.

For example, it can be applied to single use transportation tickets, whose cost must be as low as possible. In this case, the life cycle of the ticket can be as follows:

Manufacture: production of the integrated circuit and inserting the ticket without testing (if the production processes permit). This reduces the testing costs throughout the manufacturing process. However, nothing prevents the different parties along the production route from carrying out tests by sampling in order to ensure that the different stages of the process have been mastered. It should be noted that although the test can be performed in an ideal manner during the distribution stage, there is nothing to prevent it being carried out at other production process stages. During the ticket production process stages, it is obvious that the integrated circuit could be deactivated and thus tested several times for retention and/or endurance tests, provided that the content of the MCM on deactivation differs from the blocking word.

Distribution-sale: This is the stage when the ticket is present in the vending machine. Two separate operations are then performed: Testing the ticket: The invention permits an exhaustive testing of the ticket, both of all the memory points and the control logic. It is in particular possible to check the protection of the dedicated areas. At the end of the test, if the ticket is unsatisfactory, it is rejected and the following ticket is automatically positioned and tested. If the ticket is satisfactory, the blocking word is written in the MVM memory (inhibition of the "test" mode). This test procedure can take place in masked time, during the preceding valorization of the ticket or any other wait, so that no time is lost. In addition, no specific testing equipment is necessary and only a specific test program has to be developed. Valorization of the ticket: During the purchase of a ticket by a user, the informations concerning the journey are written, checked and protected (irreversible protection of the informed area following inhibition of the "test" mode).

Ticket barrier: The checking of the ticket and the obliteration thereof take place irreversibly with a high degree of reliability, because all the controls have been checked during the test.

What is claimed is:

1. Test process for reprogramable non-volatile memory, performed by a device for testing a reprogramable non-volatile memory having dedicated areas protectable in reading, writing and/or erasing and whose access rights consist of configuration words (MC) saved in a configuration area of the memory, the device comprising message transmission/reception means (10) and a received message logic control unit (11) and access controls to the memory, the device comprising at least one temporary register (13) ensuring an emulation of these access rights, so as to render access protections reversible or irreversible, the temporary register comprising a configuration register (RC) of size and structure identical to those of the memory configuration area and a test indication register (RIT), characterized in that the process comprises:

a) reading (20) the content of the memory configuration area, transferring the content into the temporary register and initializing the test indication register, b) performing (27–34) at least one modification control of the configuration register of the temporary register whilst checking the access rights contained in the temporary register, and c) testing (21–26) the modification of the configuration register by the reading and/or writing and/or erasing controls on the configuration and user memory areas (MC, MU).

2. The process according to claim 1, characterized in that, between stage a and stage b, it consists of comparing the value of the temporary register with a previously defined blocking value and, when said two values are equal, making the modifications of the configuration area irreversible and, when they are different, authorizing reversible modifications of the configuration area.

3. The process according to claim 1, characterized in that the configuration area modification controls are immediately taken into account, the new content of the configuration area being immediately transferred into the temporary register.

4. Process according to claim 1, characterized in that the modifications of the configuration area are taken into account in deferred manner.

* * * * *